(12) United States Patent
Takase

(10) Patent No.: US 7,538,037 B2
(45) Date of Patent: May 26, 2009

(54) METHOD FOR MANUFACTURING SEMICONDUCTOR DEVICE

(75) Inventor: Akihiro Takase, Oita (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 103 days.

(21) Appl. No.: 11/889,865

(22) Filed: Aug. 17, 2007

(65) Prior Publication Data

US 2008/0045024 A1 Feb. 21, 2008

(30) Foreign Application Priority Data

Aug. 21, 2006 (JP) .............................. 2006-224318

(51) Int. Cl.
*H01L 21/00* (2006.01)
(52) U.S. Cl. .................. 438/702; 438/633; 438/639
(58) Field of Classification Search .................. 438/702, 438/633, 639
See application file for complete search history.

(56) References Cited

U.S. PATENT DOCUMENTS

| | | | |
|---|---|---|---|
| 6,372,636 B1 * | 4/2002 | Chooi et al. | ................. 438/639 |
| 6,465,888 B2 * | 10/2002 | Chooi et al. | ................. 257/751 |
| 6,962,870 B2 | 11/2005 | Masuda et al. | |
| 7,098,139 B2 | 8/2006 | Tabaru | |
| 7,132,369 B2 | 11/2006 | Delgadino et al. | |
| 2002/0064941 A1 * | 5/2002 | Chooi et al. | ................. 438/633 |
| 2005/0106866 A1 | 5/2005 | Omura et al. | |
| 2006/0163739 A1 | 7/2006 | Komai et al. | |
| 2008/0045024 A1 * | 2/2008 | Takase | ....................... 438/702 |

FOREIGN PATENT DOCUMENTS

| JP | 2004-247675 | | 9/2004 |
|---|---|---|---|
| JP | 2008047821 A | * | 2/2008 |

* cited by examiner

*Primary Examiner*—Laura M Menz
(74) *Attorney, Agent, or Firm*—Finnegan, Henderson, Farabow, Garrett & Dunner L.L.P.

(57) ABSTRACT

A method for manufacturing a semiconductor device includes forming a predetermined structure including a first inorganic insulating film covering a copper interconnection, an organic insulating film formed above the first inorganic insulating film and having a hole pattern, and a second inorganic insulating film formed above the organic insulating film and having a trench pattern, dry etching the first inorganic insulating film by an etching gas containing a fluorocarbon family gas, using the organic insulating film having the hole pattern as a mask, to form a through-hole reaching the copper interconnection, and performing a plasma treatment using a mixed gas of an oxygen gas and a hydrocarbon gas, thereby removing fluorine remaining on a surface of the copper interconnection exposed by the through-hole, and thereby dry etching the organic insulating film using the second inorganic insulating film having the trench pattern as a mask.

20 Claims, 1 Drawing Sheet

METHOD FOR MANUFACTURING SEMICONDUCTOR DEVICE

CROSS-REFERENCE TO RELATED APPLICATIONS

This application is based upon and claims the benefit of priority from prior Japanese Patent Application No. 2006-224318, filed Aug. 21, 2006, the entire contents of which are incorporated herein by reference.

BACKGROUND OF THE INVENTION

1. Field of the Invention

The present invention relates to a method for manufacturing a semiconductor device.

2. Description of the Related Art

To form a via hole reaching a copper interconnection, in an interlayer insulating film, dry etching is normally performed using a fluorocarbon family gas. However, the dry etching with the fluorocarbon family gas may result in fluorine remaining on a surface of the copper interconnection. The remaining fluorine may then react with moisture in the air, causing copper corrosion. Accordingly, after the via hole is formed and before the copper interconnection is exposed to the air, the fluorine remaining on the surface of the copper interconnection needs to be removed. If an organic insulating film contained in the interlayer insulating film can be etched simultaneously with the removal of the fluorine, the removal of the fluorine and the formation of an interconnection trench based on the etching of the organic insulating film can be performed during the same step. This allows a manufacturing process to be simplified.

One method for removing the fluorine remaining on the surface of the copper interconnection is a plasma treatment using a mixed gas of a nitrogen gas ($N_2$ gas) and a hydrogen gas ($H_2$ gas) (see Jpn. Pat. Appln. KOKAI Publication No. 2004-247675). However, the plasma treatment using the $N_2/H_2$ mixed gas exhibits a high fluorine removal efficiency but offers a low etching rate for the organic insulating film contained in the interlayer insulating film. Consequently, the efficient etching of the organic insulating film is prevented by an attempt to perform, during the same step, the removal of the fluorine and the formation of an interconnection trench based on the etching of the organic insulating film.

Thus, it is conventionally difficult to efficiently perform, during the same step, the removal of the fluorine remaining on the surface of the copper interconnection and the etching of the organic insulating film.

BRIEF SUMMARY OF THE INVENTION

An aspect of the present invention, there is provided a method for manufacturing a semiconductor device, the method comprising: forming a predetermined structure including a first inorganic insulating film covering a copper interconnection, an organic insulating film formed above the first inorganic insulating film and having a hole pattern, and a second inorganic insulating film formed above the organic insulating film and having a trench pattern; dry etching the first inorganic insulating film by an etching gas containing a fluorocarbon family gas, using the organic insulating film having the hole pattern as a mask, to form a through-hole reaching the copper interconnection; and performing a plasma treatment using a mixed gas of an oxygen gas and a hydrocarbon gas, thereby removing fluorine remaining on a surface of the copper interconnection exposed by the through-hole, and thereby dry etching the organic insulating film using the second inorganic insulating film having the trench pattern as a mask.

DETAILED DESCRIPTION OF THE INVENTION

An embodiment of the present invention will be described below with reference to the drawings.

Figure 1:
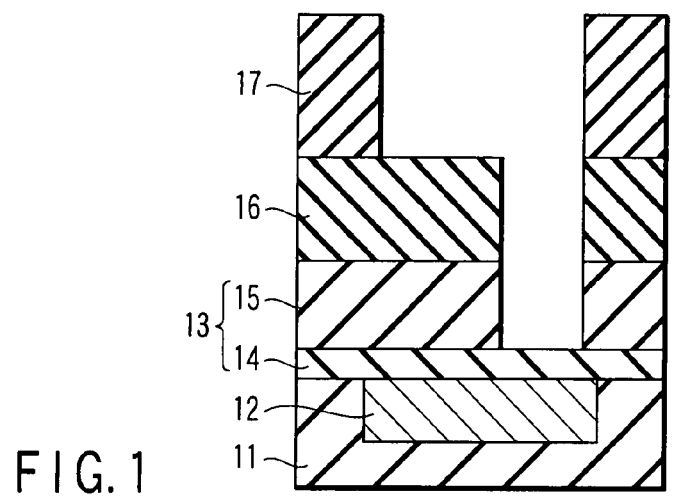
FIGS. 1 to 3 are sectional views schematically showing a method for manufacturing a semiconductor device in accordance with an embodiment of the present invention.
Figure 2:
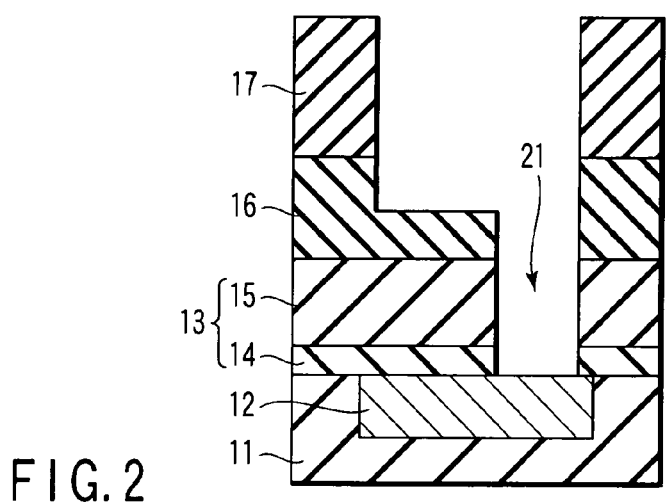
Figure 3:
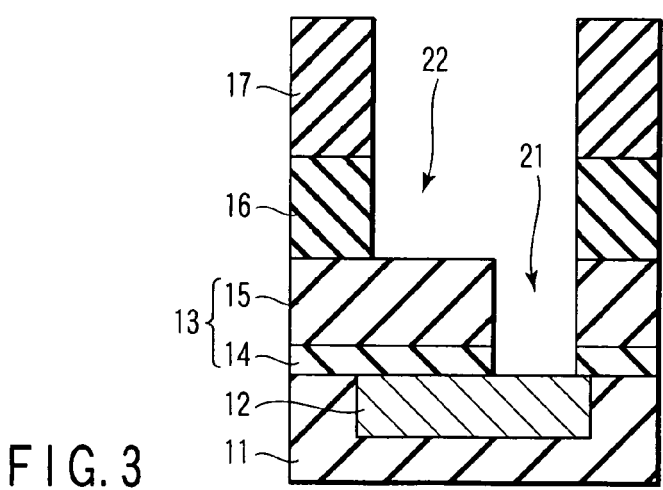

FIGS. 1 to 3 are sectional views schematically showing a method for manufacturing a semiconductor device in accordance with an embodiment of the present invention.

First, a structure shown in FIG. 1 will be described. The structure shown in FIG. 1 is as follows.

An interlayer insulating film 11 is formed on a region (not shown) including a transistor and the like. A copper interconnection 12 is formed in a trench formed in the interlayer insulating film 11. An element other than copper may be added to the copper interconnection 12 provided that the copper interconnection 12 is mainly composed of copper.

An inorganic insulating film (first inorganic insulating film) 13 is formed on the interlayer insulating film 11 and the copper interconnection 12 so as to cover the copper interconnection 12. The inorganic insulating film 13 is formed of a lower inorganic insulating film (lower portion) 14 and an upper inorganic insulating film (upper portion) 15. For example, an SiC film is used as the lower inorganic insulating film 14. For example, an SiOC film is used as the upper inorganic insulating film 15. Both the lower inorganic insulating film 14 and the upper inorganic insulating film 15 are formed by CVD (Chemical Vapor Deposition). The lower inorganic insulating film 14 has a thickness of about 35 nm. The upper inorganic insulating film 15 has a thickness of about 80 nm. A hole pattern for a via hole is formed in the upper inorganic insulating film 15.

An organic insulating film 16 is formed on the inorganic insulating film 13 and comprises a coating type low-dielectric-constant insulating film such as SiLK (manufactured by Dow Chemical Company). The organic insulating film 16 has a thickness of about 80 nm. A hole pattern corresponding to the hole pattern in the upper inorganic insulating film 15 is formed in the organic insulating film 16.

An inorganic insulating film (second inorganic insulating film) 17 is formed on the organic insulating film 16. For example, a silicon oxide film ($SiO_2$ film) is used as the inorganic insulating film 17. The inorganic insulating film 17 has a thickness of about 160 nm. A trench pattern for an interconnection trench is formed in the inorganic insulating film 17. A silicon nitride film and the like having a pattern for the formation of the trench pattern may be formed on the inorganic insulating film 17.

As described above, a predetermined structure including the inorganic insulating film 13, organic insulating film 16, and inorganic insulating film 17 is formed on the interlayer insulating film 11 and the copper interconnection 12.

Then, as shown in FIG. 2, the lower inorganic insulating film 14 is dry etched through the organic insulating film 16 having the above hole pattern, as a mask. This forms a through-hole 21 reaching the copper interconnection 12, in the inorganic insulating film 13. The through-hole 21 is used as a via hole. The dry etching is anisotropic and is performed using an etching gas containing a fluorocarbon family gas (fluorocarbon-containing gas). $CF_4$, $CHF_3$, $CH_2F_2$, or the like is used as the fluorocarbon family gas. Gas such as an Ar gas may be added to the etching gas. During the dry etching, the upper portion of the organic insulating film 16 is also dry etched through the inorganic insulating film 17 as a mask.

The through-hole 21 is formed by the above dry etching to expose the surface of the copper interconnection 12. In this case, fluorine previously contained in the fluorocarbon family gas remains on the surface of the exposed copper interconnection 12. The fluorine may react with moisture in the air, causing copper corrosion. This is a major cause of inappropriate connections. Consequently, before the copper interconnection 12 is exposed to the air, the fluorine remaining on the surface of the copper interconnection 12 needs to be removed.

Thus, as shown in FIG. 3, a plasma treatment is performed using a mixed gas of an oxygen gas and a hydrocarbon (a compound composed only of carbon and hydrogen) gas. An $O_2$ gas is used as the oxygen gas, and a $CH_4$ gas is used as the hydrocarbon gas. Conditions for the plasma treatment are, for example, as follows.
Pressure: 25 mTorr,
High frequency: 100 MHz,
High frequency power: 2,400 W,
Low frequency: 13.56 MHz,
Low frequency power: 200 W,
Gas flow ratio ($O_2/CH_4$): 0.5 to 1.0, and
Total gas flow rate: 200 to 400 sccm.

The plasma treatment removes the fluorine remaining on the surface of the copper interconnection 12. The removed material includes fluorine compounds. As is apparent from the above description, the structure having the through-hole 21 is not exposed to the air after the step of forming the through-hole 21 as shown in FIG. 2 and before the step of performing the plasma treatment as shown in FIG. 3.

The plasma treatment also anisotropically dry etches the organic insulating film 16 through the inorganic insulating film 17 as a mask. This forms a trench 22 in the organic insulating film 16, which has a bottom surface corresponding to a top surface of the inorganic insulating film 13.

In the plasma treatment, the oxygen gas is mainly used for the removal of the fluorine remaining on the surface of the copper interconnection 12 (including the removal of fluorine compounds) and the etching of the organic insulating film 16. Carbon contained in the hydrocarbon gas is mainly used to protect sidewalls of the organic insulating film 16. That is, the carbon inhibits side etching of the organic insulating film 16, promoting the anisotropic etching of the organic insulating film 16. Further, hydrogen contained in the hydrocarbon gas is mainly used to inhibit generation of copper oxides. That is, although the oxygen gas may oxidize the copper interconnection 12 to generate a copper oxide, a reduction action of hydrogen inhibits the generation of the copper oxide.

An excessively high rate of hydrocarbon gas (an excessively low rate of oxygen gas) lowers the etching rate for the organic insulating film 16. On the other hand, an excessively low rate of hydrocarbon gas (an excessively high rate of oxygen gas) degrades the protection action for the sidewalls of the organic insulating film 16. Thus, the gas flow ratio ($O_2/CH_4$) is desirably within the range of 0.5 to 1.0.

As described above, a structure is obtained in which the via hole is formed in the inorganic insulating film 13 and in which the interconnection trench is formed in the organic insulating film 16 and the inorganic insulating film 17. The subsequent steps are not particularly shown. A metal material is filled into the via hole and interconnection trench thus formed to form a via plug and a metal interconnection.

Now, evaluations of the above plasma treatment will be described.

An evaluation sample was an 8-inch silicon wafer on which the films 11 to 17 were formed. The via hole pattern was 100 μm square and no trench pattern was formed. A fluorocarbon family gas was used to expose the surface of the copper film. A plasma treatment was then performed to remove the fluorine remaining on the surface of the copper film. The plasma treatment included a plasma treatment using an $O_2/CH_4$ mixed gas, a plasma treatment using an $NH_3$ gas, and a plasma treatment using an $N_2/H_2$ mixed gas. The plasma treatment conditions were similar to those described above. The presence rate of fluorine on the copper film surface was analyzed by XPS both before and after the plasma treatment. On the basis of the analysis, the fluorine removal rate was calculated.

The fluorine removal rate was 82.7% for the plasma treatment using the $O_2/CH_4$ mixed gas, 13.8% for the plasma treatment using the $NH_3$ gas, and 89.9% for the plasma treatment using the $N_2/H_2$ mixed gas. The plasma treatment using the $O_2/CH_4$ mixed gas exhibited a significantly higher fluorine removal rate than the plasma treatment using the $NH_3$ gas. The plasma treatment using the $N_2/H_2$ mixed gas also exhibited a high fluorine removal rate but offered a lower etching rate for the organic insulating film than the plasma treatment using the $O_2/CH_4$ mixed gas. Specifically, the etching rate for the organic insulating film was about 20 seconds for the plasma treatment using the $O_2/CH_4$ mixed gas but about 30 seconds for the plasma treatment using the $N_2/H_2$ mixed gas. Therefore, the plasma treatment using the $O_2/CH_4$ mixed gas is excellent both in the fluorine removal rate and in the etching rate for the organic insulating film.

As described above, the present embodiment forms a through-hole in the inorganic insulating film using the etching gas containing the fluorocarbon family gas and then performs a plasma treatment using the mixed gas of the oxygen gas and the hydrocarbon gas. Thus, the plasma treatment with the mixed gas of the oxygen gas and the hydrocarbon gas enables the efficient removal of the fluorine remaining on the surface of the copper interconnection and the efficient etching of the organic insulating film. This makes it possible to effectively inhibit copper corrosion and to effectively form the interconnection trench.

The above embodiment uses the stack film of the lower inorganic insulating film 14 and the upper inorganic insulating film 15 as the inorganic insulating film 13. However, the inorganic insulating film 13 may be a single layer. In this case, no hole pattern needs to be present in the inorganic insulating film 13 after the step shown in FIG. 1 has been finished.

Further, in the above embodiment, in the plasma treatment shown in FIG. 3, the top surface of the inorganic insulating film 13 is exposed when the organic insulating film 16 is dry etched. However, the top surface of the inorganic insulating film 13 need not necessarily be exposed.

Furthermore, in the above embodiment, the $CH_4$ gas is used as a hydrocarbon gas for a plasma treatment. However, a $C_2H_4$ gas or a $C_2H_6$ gas may be used.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for manufacturing a semiconductor device, the method comprising:

forming a predetermined structure including a first inorganic insulating film covering a copper interconnection, an organic insulating film formed above the first inorganic insulating film and having a hole pattern, and a second inorganic insulating film formed above the organic insulating film and having a trench pattern;

dry etching the first inorganic insulating film by an etching gas containing a fluorocarbon family gas, using the organic insulating film having the hole pattern as a mask, to form a through-hole reaching the copper interconnection; and performing a plasma treatment using a mixed gas of an oxygen gas and a hydrocarbon gas, thereby removing fluorine remaining on a surface of the copper interconnection exposed by the through-hole, and thereby dry etching the organic insulating film using the second inorganic insulating film having the trench pattern as a mask.

2. The method according to claim 1, wherein the first inorganic insulating film has a lower portion and an upper portion.

3. The method according to claim 2, wherein the upper portion of the first inorganic insulating film in the predetermined structure has a hole pattern corresponding to the hole pattern in the organic insulating film, and the lower portion of the first inorganic insulating film is dry etched, in dry etching the first inorganic insulating film.

4. The method according to claim 2, wherein an SiC film is used as the lower portion of the first inorganic insulating film.

5. The method according to claim 2, wherein an SiOC film is used as the upper portion of the first inorganic insulating film.

6. The method according to claim 1, wherein an upper portion of the organic insulating film is dry etched using the second inorganic insulating film having the trench pattern as a mask, in dry etching the first inorganic insulating film.

7. The method according to claim 1, wherein the first inorganic insulating film is anisotropically etched, in dry etching the first inorganic insulating film.

8. The method according to claim 1, wherein the organic insulating film is anisotropically etched, in dry etching the organic insulating film by the plasma treatment.

9. The method according to claim 1, wherein a trench for an interconnection is formed in the organic insulating film by dry etching the organic insulating film by the plasma treatment.

10. The method according to claim 1, wherein a top surface of the first inorganic insulating film is exposed by dry etching the organic insulating film by the plasma treatment.

11. The method according to claim 1, wherein a structure having the through-hole is not exposed to air after forming the through-hole and before performing the plasma treatment.

12. The method according to claim 1, wherein the fluorocarbon family gas is selected from $CF_4$, $CHF_3$, and $CH_2F_2$.

13. The method according to claim 1, wherein the hydrocarbon gas is selected from $CH_4$, $C_2H_4$, and $C_2H_6$.

14. The method according to claim 1, wherein the oxygen gas is used to remove the fluorine remaining on the surface of the copper interconnection and to etch the organic insulating film.

15. The method according to claim 1, wherein carbon contained in the hydrocarbon gas is used to inhibit side etching of the organic insulating film.

16. The method according to claim 1, wherein hydrogen contained in the hydrocarbon gas is used to inhibit generation of a copper oxide.

17. The method according to claim 1, wherein removing fluorine by the plasma treatment includes removing a fluorine compound by the plasma treatment.

18. The method according to claim 1, wherein a coating type low-dielectric-constant insulating film is used as the organic insulating film.

19. The method according to claim 1, wherein a silicon oxide film is used as the second inorganic insulating film.

20. The method according to claim 1, wherein the hydrocarbon gas is $CH_4$, and the plasma treatment is performed with a gas flow ratio $O_2/CH_4$ set within a range of 0.5 to 1.

* * * * *